(12) United States Patent
Yang et al.

(10) Patent No.: US 12,543,334 B2
(45) Date of Patent: Feb. 3, 2026

(54) FinFET WITH LONG CHANNEL LENGTH STRUCTURE

(71) Applicant: Taiwan Semiconductor Manufacturing Company, Ltd., Hsinchu (TW)

(72) Inventors: Sung-Hsin Yang, Tainan (TW); Jung-Chi Jeng, Tainan (TW); Ru-Shang Hsiao, Hsinchu (TW); Kuo-Min Lin, Taichung (TW); Z.X. Fan, Hsinchu (TW); Chun-Jung Huang, Tainan (TW); Wen-Yu Kuo, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 530 days.

(21) Appl. No.: 17/823,507

(22) Filed: Aug. 30, 2022

(65) Prior Publication Data

US 2024/0072158 A1    Feb. 29, 2024

(51) Int. Cl.
*H10D 30/01* (2025.01)
*H10D 30/62* (2025.01)
(Continued)

(52) U.S. Cl.
CPC ....... *H10D 30/024* (2025.01); *H10D 30/6211* (2025.01); *H10D 62/151* (2025.01);
(Continued)

(58) Field of Classification Search
CPC ............ H10D 30/024; H10D 30/6211; H10D 62/151; H10D 84/013; H10D 84/0158;
(Continued)

(56) References Cited

U.S. PATENT DOCUMENTS 9,397,003 B1 * 7/2016 Niimi ................ H01L 29/66628
2014/0035045 A1 * 2/2014 Alptekin ................ H10D 84/83
257/E21.409
(Continued)

FOREIGN PATENT DOCUMENTS

TW    201813100 A    4/2018
TW    201830497 A    8/2018
(Continued)

OTHER PUBLICATIONS

First Office Action received in the corresponding Taiwan application 112126066, mailed on May 10, 2024.

*Primary Examiner* — Bitew A Dinke
(74) *Attorney, Agent, or Firm* — KILPATRICK TOWNSEND & STOCKTON LLP

(57) ABSTRACT

A method of forming a FinFET is disclosed. The method includes depositing a conductive material across each of a number of adjacent fins, depositing a sacrificial mask over the conductive material, patterning the conductive material with the sacrificial mask to form a plurality of conductive material segments, depositing a sacrificial layer over the sacrificial mask, and patterning the sacrificial layer, where a portion of the patterned sacrificial layer remains over the sacrificial mask, where a portion of the sacrificial mask is exposed, and where the exposed portion of the sacrificial mask extends across each of the adjacent fins. The method also includes removing the portion of the sacrificial layer over the sacrificial mask, after removing the portion of the sacrificial layer over the sacrificial mask, removing the sacrificial mask, epitaxially growing a plurality of source/drain regions from the semiconductor substrate, and electrically connecting the source/drain regions to other devices.

20 Claims, 8 Drawing Sheets

(51) Int. Cl.
*H10D 62/13* (2025.01)
*H10D 84/01* (2025.01)
*H10D 84/03* (2025.01)
*H10D 84/83* (2025.01)

(52) U.S. Cl.
CPC ....... *H10D 84/013* (2025.01); *H10D 84/0158* (2025.01); *H10D 84/038* (2025.01); *H10D 84/834* (2025.01)

(58) Field of Classification Search
CPC .... H10D 84/038; H10D 84/834; H10D 8/045; H10D 64/117; H10D 84/0107; H10D 84/833; H10D 30/0273; H10D 30/0275; A23B 2/783; H10F 30/2863; H10F 99/00; B65D 83/166; H01L 21/823443
See application file for complete search history.

(56) References Cited

U.S. PATENT DOCUMENTS

| | | | |
|---|---|---|---|
| 2015/0333148 A1* | 11/2015 | Koo | H01L 21/768 257/288 |
| 2016/0104708 A1* | 4/2016 | Kim | H10D 84/853 257/369 |
| 2016/0247728 A1* | 8/2016 | You | H10D 84/0167 |
| 2016/0276344 A1* | 9/2016 | Choi | H01L 29/66795 |
| 2016/0276456 A1* | 9/2016 | Hung | H10D 64/667 |
| 2017/0110569 A1* | 4/2017 | Chang | H01L 21/76895 |
| 2017/0125586 A1* | 5/2017 | Lee | H10D 30/794 |
| 2017/0133379 A1* | 5/2017 | Kim | H10D 84/85 |
| 2017/0278750 A1* | 9/2017 | Shinohara | H10B 43/30 |
| 2017/0317078 A1* | 11/2017 | Chang | H10D 84/0158 |
| 2018/0151701 A1* | 5/2018 | Chen | H01L 21/0206 |
| 2018/0157781 A1* | 6/2018 | Rastogi | H10D 89/10 |
| 2018/0174953 A1* | 6/2018 | Nam | H10D 30/62 |
| 2019/0139831 A1* | 5/2019 | Zhu | H10D 30/024 |
| 2019/0148241 A1 | 5/2019 | Chao et al. | |
| 2019/0287967 A1* | 9/2019 | Liaw | H01L 29/0692 |
| 2020/0006334 A1* | 1/2020 | Hsueh | H01L 21/32136 |
| 2020/0321435 A1 | 10/2020 | Ma et al. | |
| 2021/0057421 A1* | 2/2021 | Liaw | H10B 10/12 |
| 2021/0265366 A1 | 8/2021 | Young et al. | |
| 2021/0272951 A1* | 9/2021 | Ho | H10D 84/0151 |
| 2021/0343704 A1* | 11/2021 | Lin | H10D 84/013 |
| 2022/0093591 A1 | 3/2022 | Chu et al. | |
| 2022/0115508 A1* | 4/2022 | Lin | H01L 21/823475 |
| 2022/0376045 A1* | 11/2022 | Yang | H01L 27/0886 |

FOREIGN PATENT DOCUMENTS

| | | |
|---|---|---|
| TW | 201916120 A | 4/2019 |
| TW | 202011605 A | 3/2020 |
| TW | 202133347 A | 9/2021 |
| TW | 202209445 A | 3/2022 |

\* cited by examiner

US 12,543,334 B2

FinFET WITH LONG CHANNEL LENGTH STRUCTURE

TECHNICAL FIELD

The subject matter described herein relates to FinFET structures, and more particularly to FinFET transistors having long channel lengths.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate. The layers may be arranged so as to form a number of electrical components, such as transistors, resistors, and capacitors which constitute electrical circuits or parts of electrical circuits.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
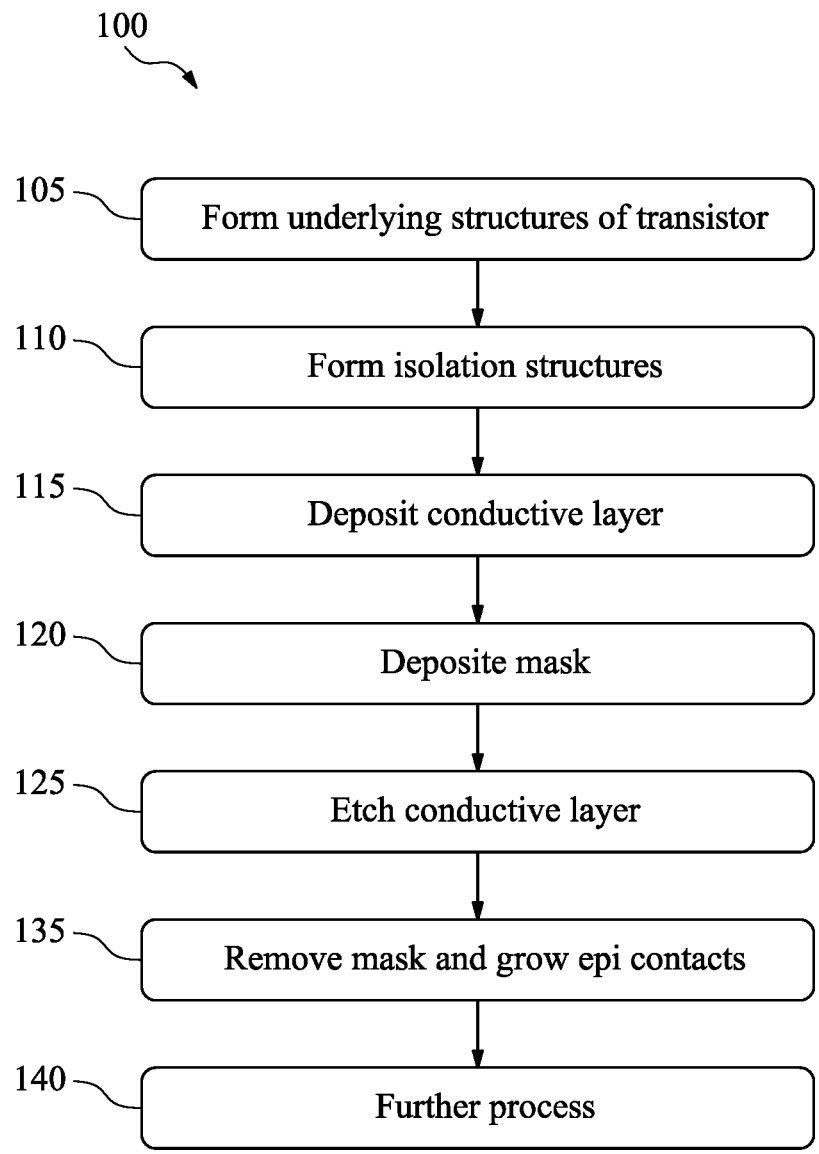
FIG. 1 illustrates a flowchart diagram showing a method of forming a FinFET transistor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

In some semiconductor circuits, certain transistor devices have gate lengths which are long compared to gate lengths of other transistor devices, for example in other areas of the semiconductor circuit. For example, in an input output area (I/O area), transistors may have a gate length which is longer than the gate length of transistors in, for example, a digital standard cell area, where the gate lengths may, for example, be the minimum gate length allowed by the technology. The transistors in the I/O area may, for example, have a gate length greater than the minimum gate length allowed by the technology for various reasons known to those of skill in the art. In some embodiments, longer lengths are used to improve transistor noise performance or transistor matching, and/or are used in devices having transistors of different threshold voltages.

To form the gate structures of the transistors, a conductor layer is deposited and patterned using a sacrificial mask. After the conductor layer is patterned, the sacrificial mask is removed, for example, using an etching process. Because of the geometries resulting from using gates of long length, the etching process for removing the sacrificial mask is susceptible to incomplete removal of the sacrificial mask for transistors having gates of long length. As a consequence, during further processing of the transistors the gate structures of transistors having long gate lengths may be malformed.

Embodiments disclosed in more detail below provide methods and structures which use various sacrificial layers which are formed on the sacrificial mask, are patterned and/or planarized, and are removed such that removal of the sacrificial mask is complete even in areas having transistors with long gate lengths.

The embodiments are described in the context of Fin-FETs. The fins of FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a semiconductor substrate and patterned using a photolithography process. Spacers are formed alongside the patterned sacrificial layer using a self-aligned process. The patterned sacrificial layer is then removed, and the remaining spacers may then be used to pattern the fins. Implementations of some aspects may be used in other devices.

A person having ordinary skill in the art will readily understand that implementations of some or all aspects may be used in certain or any other transistor structures.

FIG. 1 illustrates a flowchart diagram showing a method or process 100 of forming a FinFET transistor device, according to some embodiments.

Figure 2A:
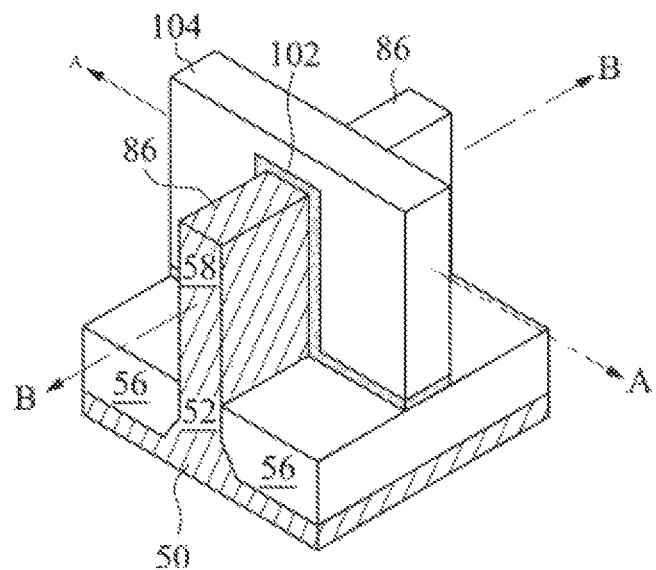
FIG. 2A illustrates a perspective view of a FinFET transistor device, according to some embodiments.

FIG. 2A illustrates a perspective view of a FinFET transistor device, according to some embodiments. FIG. 2A illustrates an example of a FinFET which can be formed using the process 100 of FIG. 1, in accordance with some embodiments. The FinFET transistor device is illustrated in a three-dimensional view, and comprises a fin 58 on a semiconductor substrate 50. STI regions 56 are formed on the semiconductor substrate 50, and the fin 58 protrudes above and from between neighboring STI regions 56. A gate dielectric layer 102 is along sidewalls and over a top surface of the fin 58, and a gate electrode 104 is over the gate dielectric layer 102. Epitaxial source/drain regions 86 are disposed in opposite sides of the fin 58 with respect to the gate dielectric layer 102 and gate electrode 104.

FIG. 2A further illustrates reference cross-sections that are used in later figures. Cross-section A-A is across a channel, gate dielectric layer 102, and gate electrode 104 of the FinFET transistor device. Cross-section B-B is perpendicular to cross-section A-A and is along a longitudinal axis of the fin 58 and in a direction of, for example, a current flow between the epitaxial source/drain regions 86. Subsequent figures refer to these reference cross-sections for clarity.

Embodiments may be practiced in the context of FinFET transistor devices formed, for example, using a gate-last process or a gate-first process. Also, some embodiments may be practiced using other transistor device arrangements.

FIGS. 2B-2J illustrate cross-sectional views of a FinFET transistor device at various stages of the process of FIG. 1, according to some embodiments. FIGS. 2B-2E illustrate a FinFET transistor device shown along reference cross-section A-A illustrated in FIG. 2A at various stages of the process of FIG. 1, according to some embodiments. FIGS. 2F-2J illustrate the FinFET transistor device shown along reference cross-section B-B illustrated in FIG. 2A at various stages of the process of FIG. 1, according to some embodiments.

In some embodiments, the three transistors of section 200A have a gate length equal to the minimum dimension allowed by process design rules. In some embodiments, the single transistor of section 200B has a gate length greater than or substantially equal to about 0.10 µm, about 0.12 µm, about 0.14 µm, about 0.15 µm, about 0.175 µm, about 0.19 µm, about 0.2 µm, about zero point to 2 µm, about 0.24 µm, about 0.25 µm, about 0.275 µm about 0.3 µm, about 0.35 µm, about 0.4 µm, about 0.45 µm, about 0.5 µm, about 0.55 µm, about 0.6 µm, about 0.65 µm, about 0.7 µm, about 0.75 µm, or another length.

In some embodiments, a ratio of the gate length of the single transistor of section 200B to the minimum gate length dimension allowed by process design rules is greater than or substantially equal to about 2:1, about 3:1, about 4:1, about 5:1, about 6:1, about 7:1, about 8:1, about 9:1, about 10:1, about 15:1, about 20:1, about 25:1, about 30:1, about 50:1, about 75:1, about 100:1 or another ratio.

Figure 2B:
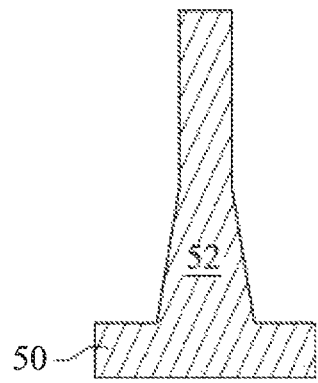
FIGS. 2B-2J illustrate cross-sectional views of a FinFET transistor device at various stages of the process of FIG. 1, according to some embodiments.

At operation 105 of the process 100 of FIG. 1, fin structures are formed in a semiconductor substrate 50, as shown in FIG. 2B. The semiconductor substrate 50 may be a semiconductor substrate, such as a bulk semiconductor, a semiconductor-on-insulator (SOI) substrate, or the like, which may be doped (e.g., with a p-type or an n-type dopant) or undoped. The semiconductor substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a semiconductor substrate 50, typically a silicon or glass substrate. Other substrates, such as a multi-layered or gradient substrate may also be used. In some embodiments, the semiconductor material of the semiconductor substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fin 52 is a semiconductor strip. In some embodiments, the fin 52 may be formed in the semiconductor substrate 50 by etching trenches in the semiconductor substrate 50. The etching may be any acceptable etch process, such as a reactive ion etch (ME), neutral beam etch (NBE), the like, or a combination thereof. The etch may be anisotropic. Other etching techniques may be used.

Figure 2C:
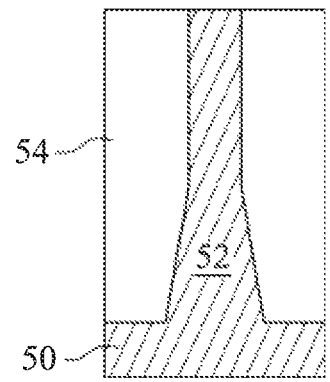

Also at operation 105 of the process 100 of FIG. 1, an insulation material 54 is formed over the semiconductor substrate 50 and between neighboring fin 52, as shown in FIG. 2C. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fin 52.

Figure 2D:
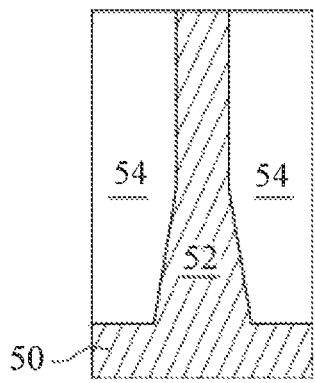

Also at operation 105 of the process 100 of FIG. 1, a planarization process is applied to the insulation material 54, as shown in FIG. 2D. In some embodiments, the planarization process includes a chemical mechanical polish (CMP), an etch back process, combinations thereof, or the like. The planarization process exposes the fin 52. Top surfaces of the fin 52 and the insulation material 54 are level after the planarization process is complete.

Figure 2E:
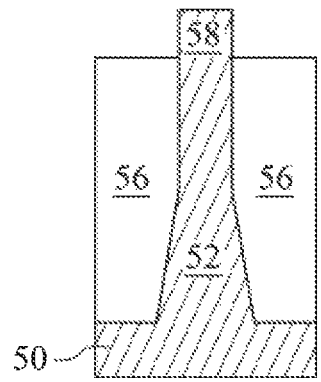

Also at operation 105 of the process 100 of FIG. 1, the insulation material 54 is recessed to form Shallow Trench Isolation (STI) regions 56, as shown in FIG. 2E. The insulation material 54 is recessed such that fin 58 protrudes from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal etch or an Applied Materials SICONI tool or dilute hydrofluoric (dHF) acid may be used.

A person having ordinary skill in the art will readily understand that the process described with respect to FIGS. 2B through 2E is just one example of how the fin 58 may be formed. In some embodiments, a dielectric layer can be formed over a top surface of the semiconductor substrate 50; trenches can be etched through the dielectric layer; homoepitaxial structures can be epitaxially grown in the trenches; and the dielectric layer can be recessed such that the homoepitaxial structures protrude from the dielectric layer to form fins 58. In some embodiments, heteroepitaxial structures can be used for the fin 52. For example, the fin 52 in FIG. 2D can be recessed, and a material different from the fin 52 may be epitaxially grown in their place. In an even further embodiment, a dielectric layer can be formed over a top surface of the semiconductor substrate 50; trenches can be etched through the dielectric layer; heteroepitaxial structures can be epitaxially grown in the trenches using a material different from the semiconductor substrate 50; and the dielectric layer can be recessed such that the heteroepitaxial structures protrude from the dielectric layer to form the fin 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 58 may be formed from silicon germanium (SixGe1-x, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate doped regions (not shown, sometimes referred to as well regions) may be formed in the fin 58, the fin 52, and/or the semiconductor substrate 50.

FIGS. 2F-2I illustrate the FinFET transistor device shown along reference cross-section B-B illustrated in FIG. 2A at various stages of the process of FIG. 1, according to some embodiments.

FIGS. 2F-2J may illustrate sections 200A and 200B along a single fin 58. FIGS. 2F-2J may illustrate sections 200A and 200B on different fins 58. Section 200A illustrates three FinFET transistors at various stages of the process of FIG. 1, according to some embodiments, and section 200B illustrates a single FinFET transistor at various stages of the process of FIG. 1, according to some embodiments. As illustrated, the gate lengths of the three transistors of section 200A are less than the gate length of the single transistor of section 200B.

Figure 2F:
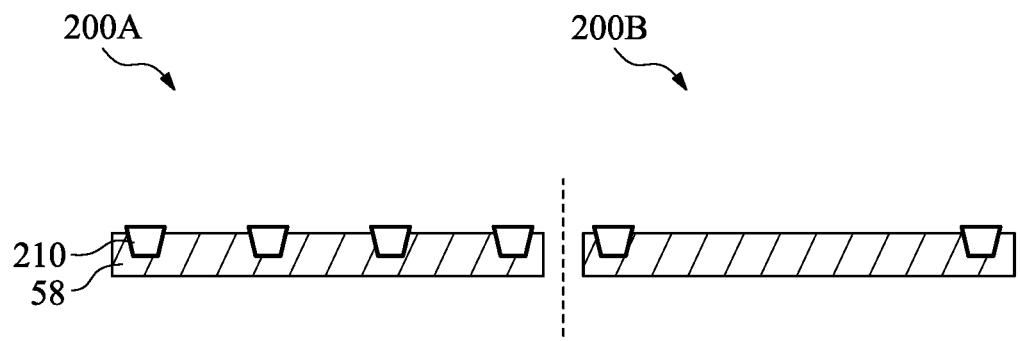

At operation 110 of the process 100 of FIG. 1, isolation structures 210 are formed along fin or fins 58, as shown in FIG. 2F. To form the isolation structures 210, an insulation material may be formed over the fin or fins 58, as shown in FIG. 2F. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by a FCVD process. An anneal process may be performed once the insulation material is formed. In an embodiment, the insulation material is formed such that excess insulation material extends from fin 52. Other methods may be used to form isolation structures 210 on fin or fins 58.

Figure 2G:
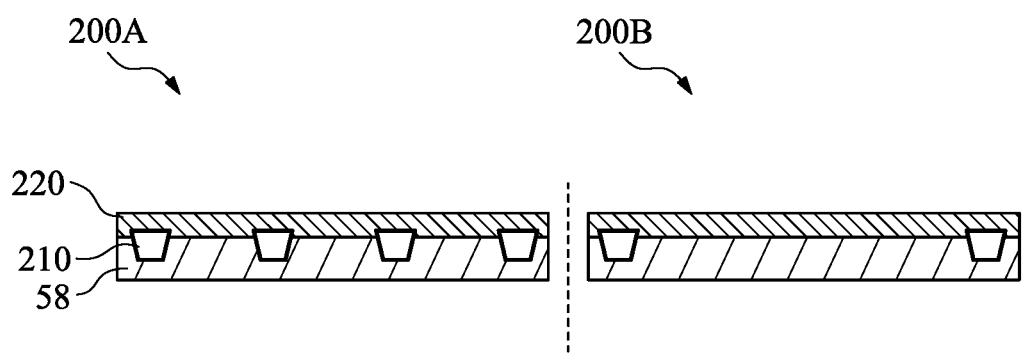

At operation 115 of the process 100 of FIG. 1, a conductive material 220 is formed over the fin or fins 58, as shown in FIG. 2G.

A conductive material 220 is formed over the fin or fins 58 and the isolation structures 210. The conductive material 220 may be deposited over the fin or fins 58 and the isolation structures 210 and then planarized, such as by a CMP process. The conductive material 220 may comprise a conductive material and may be selected from a group including polycrystalline silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The conductive material 220 may be deposited by physical vapor deposition (PVD), CVD, sputter deposition, or other techniques known and used in the art for depositing conductive materials.

Figure 2H:
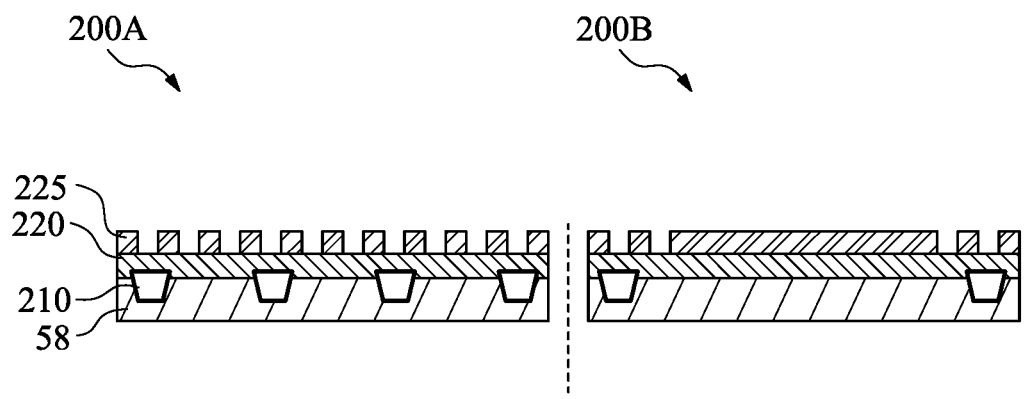

At operation 120 of the process 100 of FIG. 1, a sacrificial mask 225 is formed across fin or fins 58 over conductive material 220, as shown in FIG. 2H. The sacrificial mask 225 may be deposited over the conductive material 220. The sacrificial mask 225 may include, for example, SiN, SiON, or the like.

In some embodiments, a single conductive material 220 and a single sacrificial mask 225 are formed in both the section 200A and in the section 200B. In some embodiments, separate conductive materials 220 may be formed in the section 200A and the section 200B, and/or separate sacrificial masks 225 may be formed in the section 200A and the section 200B.

Also at operation 120 of the process 100 of FIG. 1, sacrificial mask 225 is patterned using acceptable photolithography and etching techniques to form sacrificial masks 225, as shown in FIG. 2H, and as understood by those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

Figure 2I:
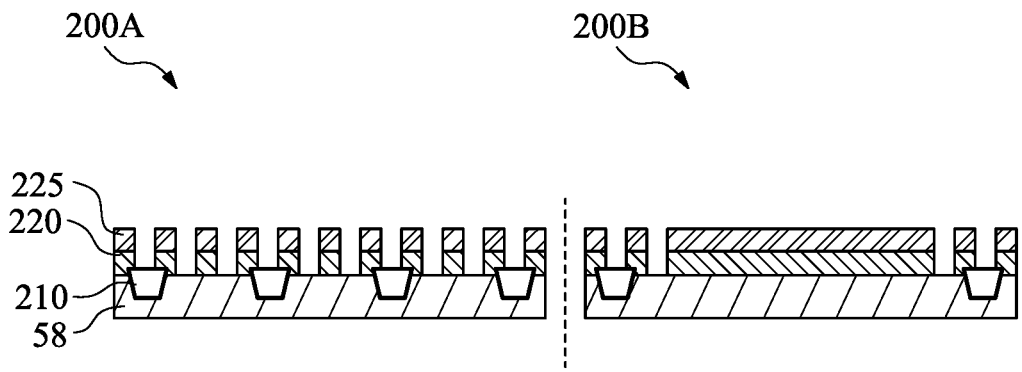

At operation 125 of the process 100 of FIG. 1, the conductive material 220 along fin or fins 58 is patterned, as shown in FIG. 2I. The conductive material 220 may be patterned using acceptable photolithography and etching techniques, as shown in FIG. 2I, and as understood by those of skill in the art. The etching may be any acceptable etch process, such as a reactive ion etch (ME), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

The pattern of the sacrificial mask 225 may be transferred to the conductive material 220 by an acceptable etching technique as understood by those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

Figure 2J:
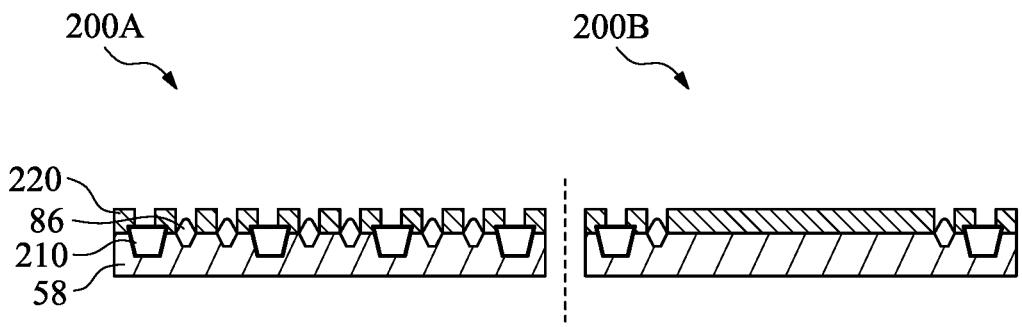

At operation 135 of the process 100 of FIG. 1, epitaxial source/drain regions 86 are grown at various locations along fin or fins 58, as shown in FIG. 2J.

The epitaxial source/drain regions 86 in the section 200A are formed to be spaced according to the gate lengths of the three transistors in section 200A, and epitaxial source/drain regions 86 in the section 200B are formed to be spaced according to the gate lengths of the single transistor in section 200B. The epitaxial source/drain regions 86 may be formed by masking and etching source/drain regions of the fin or fins 58 to form recesses in the fin or fins 58. Then, the epitaxial source/drain regions 86 are epitaxially grown in the recesses. The epitaxial source/drain regions 86 may include any acceptable material, such as appropriate for the FinFET transistor being formed. For example, if the fin or fins 58 are silicon for the formation of n-type FinFET transistors, the epitaxial source/drain regions 86 may include silicon, SiC, SiCP, SiP, or the like. In addition, if the fin or fins 58 are silicon for the formation of p-type FinFET transistors, the epitaxial source/drain regions 86 may include silicon, SiGe, SiGeB, Ge, GeSn, or the like. The epitaxial source/drain regions 86 may have surfaces raised from respective surfaces of the fin or fins 58 and may have facets.

The epitaxial source/drain regions 86 may be in situ doped during growth to form source/drain regions. The epitaxial source/drain regions 86 may have an impurity concentration of between about $10^{19}$ cm$^{-3}$ and about $10^{21}$ cm$^{-3}$. The n-type and/or p-type impurities for source/drain regions may be any of the impurities known to those of skill in the art. If the epitaxial source/drain regions 86 are in situ doped during growth, they may be not doped by implantation. However, the doping profile and concentration of the epitaxial source/drain regions 86 produced according to some embodiments may be similar to that which would be produced if the epitaxial source/drain regions 86 were doped by implantation.

Also at operation 135 of the process 100 of FIG. 1, the patterned sacrificial mask 225 is removed, as shown in FIG. 2J. Embodiments of methods to remove the patterned sacrificial mask 225 are discussed in more detail elsewhere herein. Other methods to remove the patterned sacrificial mask 225 may be used.

In some embodiments, the epitaxial source/drain regions 86 are grown after the patterned sacrificial mask 225 is removed. In some embodiments, the patterned sacrificial mask 225 is removed after the epitaxial source/drain regions 86 are grown.

The FinFET NMOS and PMOS transistors are formed in areas sometimes known as oxide definition (OD) areas, or active areas. An OD area is between inactive areas, such as isolation structures 210 or field oxide (FOX) areas (not shown). The OD area defines an active area for each transistor, i.e., the area where the source, drain and channel under the gate of transistor are formed.

In the illustrated embodiments, each OD area is between adjacent isolation structures 210. Accordingly, as shown, each OD area includes a dummy segment of patterned conductive material 220 which adjacent to one of the isolation structures 210 bounding the OD area. In some embodiments, the dummy segments of patterned conductive material 220 form poly on OD (or diffusion) edge (PODE) segments.

Figure 2K:
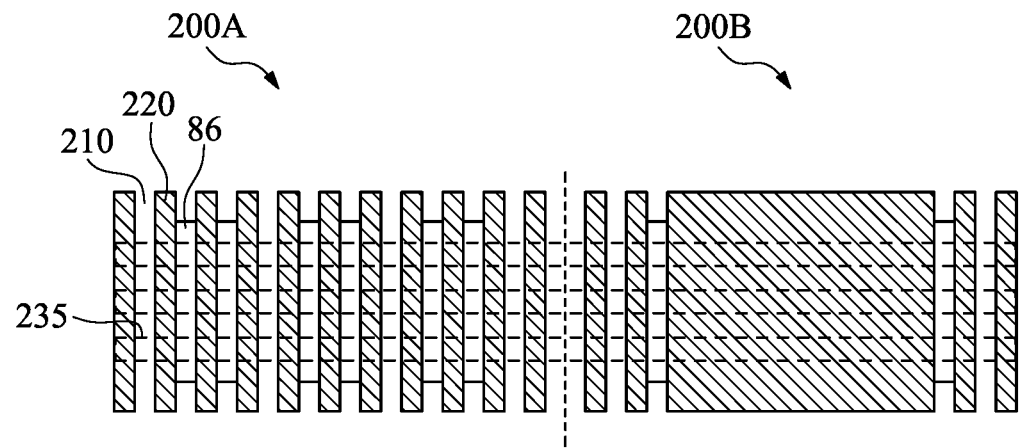
FIG. 2K illustrates a top down view of the FinFET transistor device after the mask removal process of the process of FIG. 1, according to some embodiments.

FIG. 2K illustrates a top down view of the FinFET transistor device after the epitaxial source/drain regions 86 are grown and after the patterned sacrificial mask 225 is removed, according to some embodiments. As illustrated, the top down view of FIG. 2K shows that each of the isolation structures 210, each of the patterned conductive material 220, and each of the epitaxial source/drain regions 86 extend across the tops 235 of multiple fins 58.

At operation 140 of the process 100 of FIG. 1, further processing of the FinFET transistor device is performed to complete the fabrication process. For example, at operation 140, transistor gates may be formed or further formed using techniques known to those of skill in the art. In addition, other processes may be performed to further fabricate the FinFET transistor device. Furthermore, metal lines, as well as other multilayer interconnect features such as ILD layers and interconnect layers, configured to connect the various features, for example, source and drain connections, of the FinFET transistor device to other devices so as to generate a functional circuit that may include the FinFET transistor device.

Figure 3:
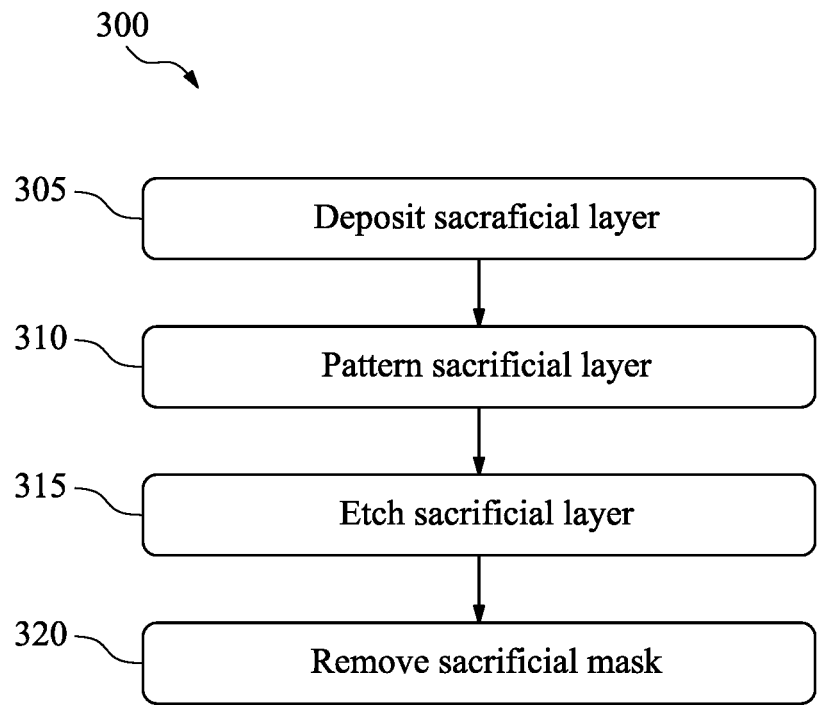
FIG. 3 illustrates a flowchart diagram showing a method of removing a mask, according to some embodiments.

FIG. 3 illustrates a flowchart diagram showing a method 300 of removing a sacrificial mask 225, according to some embodiments. The method 300 may be used, for example, at operation 135 of process 100 of FIG. 1. The method 300 may be used in other methods of forming semiconductor devices. In addition, other methods of removing a sacrificial mask 225 may be used at operation 135 of process 100.

In the illustrated embodiment, the epitaxial source/drain regions 86 are grown prior to removing the sacrificial mask 225. In some embodiments, the epitaxial source/drain regions 86 is grown after removing the sacrificial mask 225.

Figure 4A:
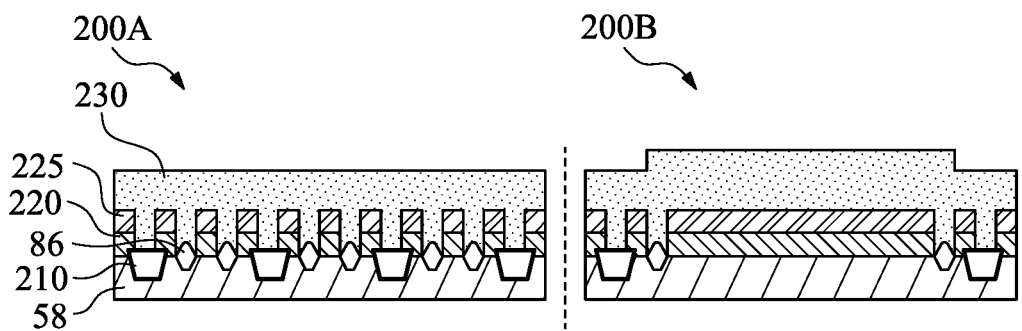
FIG. 4A-4D illustrate cross-sectional views of a FinFET transistor device at various stages of the process of FIG. 3, according to some embodiments.

At operation 305 of method 300, a sacrificial layer 230 is deposited, for example, as shown in FIG. 4A. In some embodiments, the sacrificial layer 230 comprises a photoresist layer. In some embodiments, the sacrificial layer 230 comprises a dielectric material, such as phosphosilicate glass (PSG), borosilicate glass (BSG), boron doped phosphosilicate glass (BPSG), undoped silicate glass (USG), or the like. In some embodiments, the sacrificial mask 225 is deposited using CVD process, a FCVD process, a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

In the illustrated embodiment, the sacrificial layer 230 has an upper surface topology corresponding with the sacrificial mask 225, as illustrated in FIG. 4A. For example, the upper surface of the sacrificial layer 230 is closer to the fin 58 in areas where the sacrificial mask 225 has openings, and is farther from the fin 58 where the sacrificial mask 225 does not have openings, as illustrated in FIG. 4A.

Figure 4B:
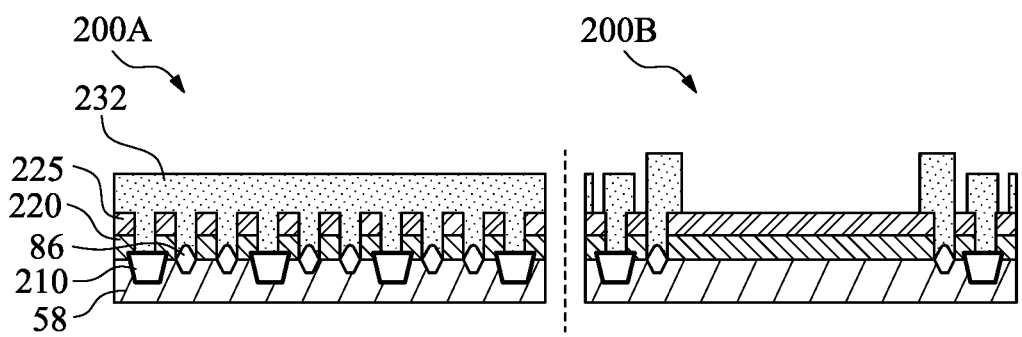

At operation 310 of method 300, the sacrificial layer 230 is patterned, for example, as shown in FIG. 4B. The sacrificial layer 230 may be patterned using acceptable photolithography and etching techniques, as shown in FIG. 4B, and as understood by those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In the illustrated embodiment, the sacrificial layer 230 is patterned so as to create an opening therein in a location corresponding with the gate of the single transistor in section 200B. In addition, the sacrificial layer 230 is patterned so as to create openings therein in locations corresponding with the other sections of sacrificial mask 225 nearest the gate of the single transistor in section 200B.

Figure 4C:
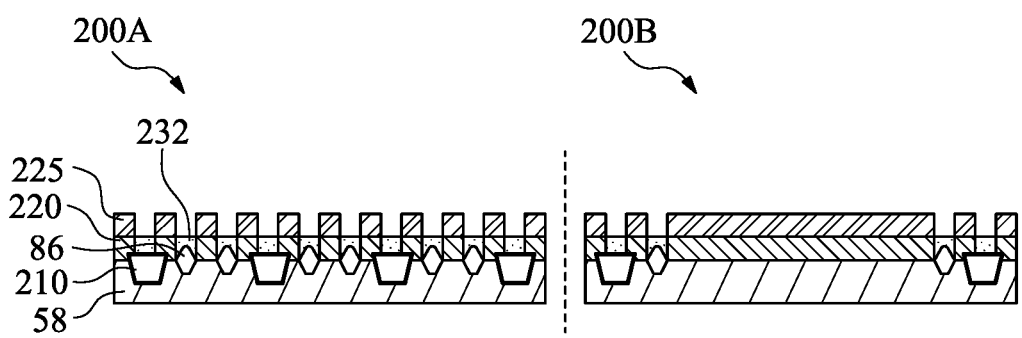

At operation 315 of method 300, the sacrificial layer 230 is removed from the upper portion of sacrificial mask 225, for example, as shown in FIG. 4C. In some embodiments, the sacrificial layer 230 is removed using one or more etching techniques known to those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In some embodiments, after the sacrificial layer 230 is removed from the upper portion of sacrificial mask 225, portions of the sacrificial layer 230 remain over isolation structures 210 and over the epitaxial source/drain regions 86, or the gaps in sacrificial mask 225 corresponding with the epitaxial source/drain regions 86.

Figure 4D:
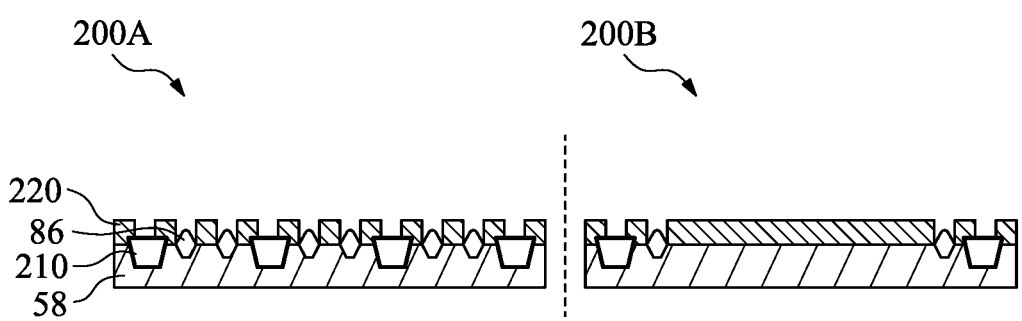

At operation 320 of method 300, the sacrificial mask 225 is removed, for example, as shown in FIG. 4D. In some embodiments, the sacrificial mask 225 is removed using an etching technique known to those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In some embodiments, at operation 320 of method 300, the portions of the sacrificial layer 230 remaining over isolation structures 210 and over the epitaxial source/drain regions 86, or the gaps in sacrificial mask 225 corresponding with the epitaxial source/drain regions 86 are also removed, for example, as shown in FIG. 4D. In some embodiments, the remaining portions of sacrificial layer 230 are removed using an etching technique known to those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In some embodiments, the remaining portions of sacrificial layer 230 are removed using the same etching process as that used to remove the sacrificial mask 225. In some embodiments, the remaining portions of sacrificial layer 230 are removed using a separate etching process as that used to remove the sacrificial mask 225.

In some embodiments, another layer formed over the patterned conductive material 220. For example, in some embodiments, a nitride layer (not shown) is formed over the patterned conductive material 220, and is removed by an etching process. In some embodiments, the etching process may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In some embodiments, the other layer is removed using the same etching process as that used to remove either or both of the sacrificial mask 225 and the remaining portions of sacrificial layer 230. In some embodiments, the other layer is removed using a separate etching process as that used to remove either or both of the sacrificial mask 225 and the remaining portions of sacrificial layer 230.

Figure 5:
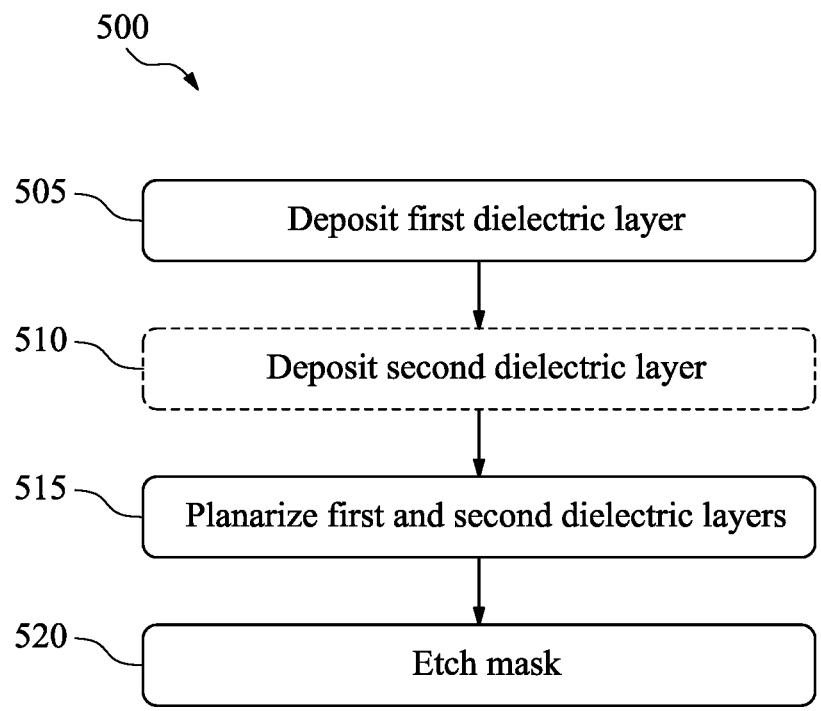
FIG. 5 illustrates a flowchart diagram showing a method of removing a mask, according to some embodiments.

FIG. 5 illustrates a flowchart diagram showing a method 500 of removing a sacrificial mask 225, according to some embodiments. The method 500 may be used, for example, at operation 135 of process 100 of FIG. 1. The method 500 may be used in other methods of forming semiconductor devices. In addition, other methods of removing a sacrificial mask 225 may be used at operation 135 of process 100.

In the illustrated embodiment, the epitaxial source/drain regions 86 are grown prior to removing the sacrificial mask 225. In some embodiments, the epitaxial source/drain regions 86 is grown after removing the sacrificial mask 225.

Figure 6A:
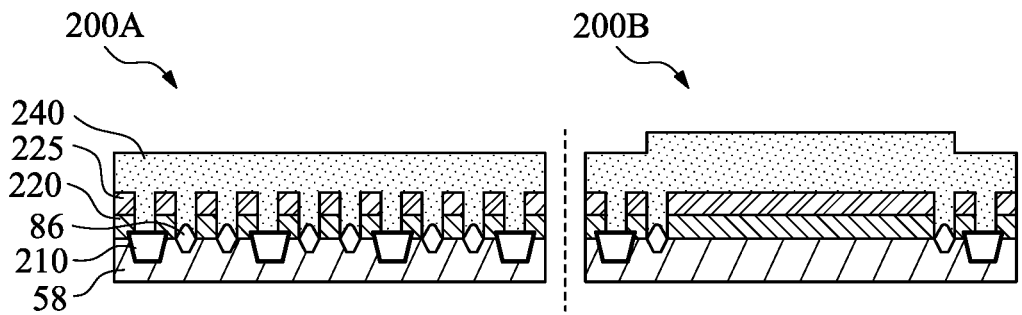
FIG. 6A-6D illustrate cross-sectional views of a FinFET transistor device at various stages of the process of FIG. 5, according to some embodiments.

At operation 505 of method 500, a first dielectric layer 240 is deposited, for example, as shown in FIG. 6A. In some embodiments, the first dielectric layer 240 comprises an ILD material layer. In some embodiments, the first dielectric layer 240 comprises a dielectric material, such as phosphosilicate glass (PSG), borosilicate glass (BSG), boron doped phosphosilicate glass (BPSG), undoped silicate glass (USG), or the like. In some embodiments, the first dielectric layer 240 is deposited using CVD process, a FCVD process, a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

In the illustrated embodiment, the first dielectric layer 240 has an upper surface topology corresponding with the sacrificial mask 225, as illustrated in FIG. 6A. For example, the upper surface of the first dielectric layer 240 is closer to the fin 58 in areas where the sacrificial mask 225 has openings, and is farther from the fin 58 where the sacrificial mask 225 does not have openings, as illustrated in FIG. 6A.

Figure 6B:
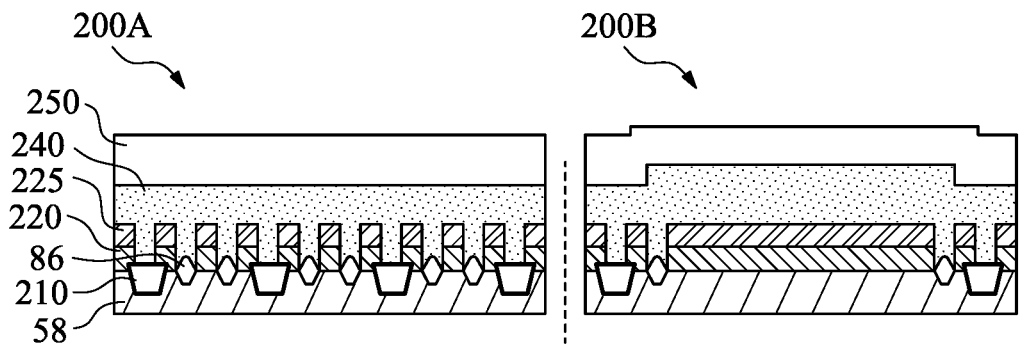

At optional operation 510 of method 500, a second dielectric layer 250 is deposited, for example, as shown in FIG. 6B. In some embodiments, the second dielectric layer 250 comprises an ONO layer (oxide-nitride-oxide layer), an ultra-violet silicon nitride layer (UVSiN layer), or a physical enhanced oxidation (PEOX) layer. In some embodiments, the second dielectric layer 250 comprises a dielectric material, such as phosphosilicate glass (PSG), borosilicate glass (BSG), boron doped phosphosilicate glass (BPSG), undoped silicate glass (USG), or the like. In some embodiments, the second dielectric layer 250 is deposited using CVD process, a FCVD process, written a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

In the illustrated embodiment, the second dielectric layer 250 has an upper surface topology corresponding with the sacrificial mask 225, as illustrated in FIG. 6B. For example, the upper surface of the second dielectric layer 250 is closer to the fin 58 in areas where the sacrificial mask 225 has openings, and is farther from the fin 58 where the sacrificial mask 225 does not have openings, as illustrated in FIG. 6B. However, as illustrated the effect on the upper surface topology of the second dielectric layer 250 is less significant than that of the first dielectric layer 240, as illustrated in FIGS. 6A and 6B. In some embodiments, the second dielectric layer 250 has substantially no upper surface topology corresponding with the sacrificial mask 225.

Figure 6C:
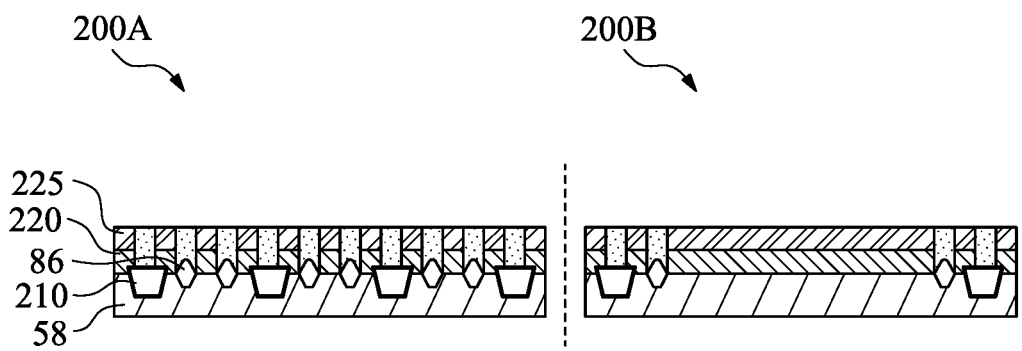

At operation 515 of method 500, the first and second dielectric layers 240 and 250 are planarized such that none of the first and second dielectric layers 240 and 250 remain over the sacrificial mask 225, as illustrated in FIG. 6C. In some embodiments, the planarization process includes a chemical mechanical polish (CMP), an etch back process, combinations thereof, or the like. The planarization process exposes the sacrificial mask 225. In some embodiments, top surfaces of the sacrificial mask 225 and first dielectric layer 240 are substantially level after the planarization process is complete.

Figure 6D:
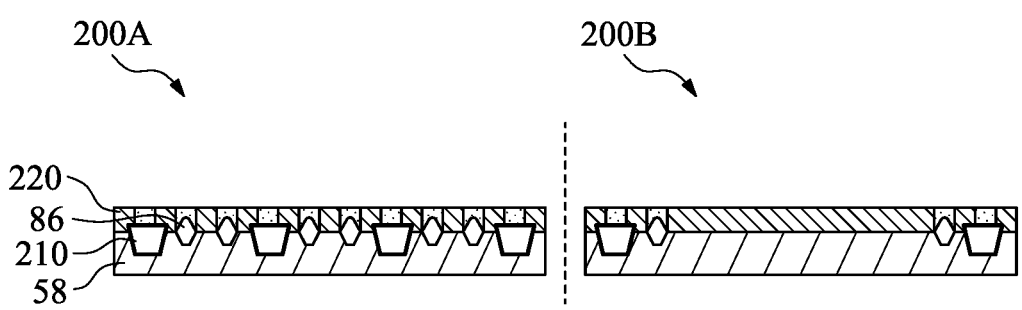

At operation 520 of method 500, the sacrificial mask 225 is removed, for example, as shown in FIG. 6D. In some embodiments, the sacrificial mask 225 is removed using an etching technique known to those of skill in the art. The etching may be any acceptable etch process, such as a reactive ion etch (RIE), neutral beam etch (NBE), the like, or a combination thereof. The etch may be anisotropic. In some embodiments, a chemical oxide removal etch or an Applied Materials SICONI tool or dilute hydrofluoric (dHF) acid may be used. Other etching techniques may be used.

In some embodiments, after the sacrificial mask 225 is removed, portions of the first dielectric layer 240 remain over isolation structures 210 and over the epitaxial source/drain regions 86, or the gaps in sacrificial mask 225 corresponding with the epitaxial source/drain regions 86.

As discussed in further detail above, reliable methods of forming transistors with long length gates are illustrated. The methods are reliable at least because they effectively remove the sacrificial mask used to pattern the conductive layers formed on the fins of the FinFET devices.

One inventive aspect is a method of forming a FinFET semiconductor device. The method includes forming a plurality of adjacent fins in a semiconductor substrate, depositing a conductive material over the semiconductor substrate, where the conductive material is deposited across each of the adjacent fins, depositing a sacrificial mask over the conductive material, where the sacrificial mask is deposited across each of the adjacent fins, patterning the conductive material with the sacrificial mask to form a plurality of conductive material segments, where each of the conductive material segments extends across each of the adjacent fins, depositing a sacrificial layer over the sacrificial mask, where the sacrificial layer is formed across each of the adjacent fins, and patterning the sacrificial layer, where a portion of the patterned sacrificial layer remains over the sacrificial mask, where a portion of the sacrificial mask is exposed, and where the exposed portion of the sacrificial mask extends across each of the adjacent fins. The method also includes removing the portion of the sacrificial layer over the sacrificial mask, after removing the portion of the sacrificial layer over the sacrificial mask, removing the sacrificial mask, epitaxially growing a plurality of source/drain regions from the semiconductor substrate, where the source/drain regions are grown across each of the adjacent fins, and electrically connecting the source/drain regions to other devices.

In some embodiments, the conductive material includes polycrystalline silicon.

In some embodiments, the sacrificial layer includes a photoresist layer.

In some embodiments, patterning the sacrificial layer includes creating an opening in the sacrificial layer in a location corresponding with a gate of first and second transistor.

In some embodiments, the first transistor has a first gate length greater than a minimum gate length dimension allowed by process design rules.

In some embodiments, the second transistor has a second gate length substantially equal to the minimum gate length dimension allowed by process design rules.

In some embodiments, where patterning the sacrificial layer includes creating an opening in the sacrificial layer in a location corresponding with the sacrificial mask between an isolation structure and one of the source/drain regions.

In some embodiments, a conductive material segment in a location between an isolation structure and one of the source/drain regions forms a poly on OD edge (PODE) dummy segment.

Another inventive aspect is a method of forming a FinFET semiconductor device. The method includes forming a plurality of adjacent fins in a semiconductor substrate, depositing a conductive material over the semiconductor substrate, where the conductive material is deposited across each of the adjacent fins, depositing a sacrificial mask over the conductive material, where the sacrificial mask is deposited across each of the adjacent fins, patterning the conductive material with the sacrificial mask to form a plurality of conductive material segments, where each of the conductive material segments extends across each of the adjacent fins, depositing a first dielectric layer over the sacrificial mask, where the first dielectric layer is deposited across each of the adjacent fins, depositing a second dielectric layer over the sacrificial mask, where the second dielectric layer is deposited across each of the adjacent fins, planarizing the first and second dielectric layers such that none of the first and second dielectric layers remain over the sacrificial mask, and after planarizing the first and second dielectric layers, removing the sacrificial mask, epitaxially growing a plurality source/drain regions from the semiconductor substrate, where the source/drain regions are grown across each of the adjacent fins, and electrically connecting the source/drain regions to other devices.

In some embodiments, the conductive material includes polycrystalline silicon.

In some embodiments, the first dielectric layer includes an ILD material layer.

In some embodiments, the second dielectric layer includes a physical enhanced oxidation (PEOX) layer.

In some embodiments, after planarizing the first and second dielectric layers, a gap in the sacrificial mask a location corresponding with one of the source/drain regions is filled with the first dielectric layer.

In some embodiments, a conductive material segment in a location between an isolation structure and one of the source/drain regions forms a poly on OD edge (PODE) dummy segment.

In some embodiments, the method further includes forming first and second transistors, where the first transistor has a gate length greater than a minimum gate length dimension allowed by process design rules, and where the second transistor has a gate length substantially equal to the minimum gate length dimension allowed by process design rules.

Another inventive aspect is a method of forming a FinFET semiconductor device. The method includes forming a plurality of first adjacent fins in a first transistor region of a semiconductor substrate, forming a plurality of second adjacent fins in a second transistor region of the semiconductor substrate, and depositing a conductive material over first and second gate regions of first and second transistors, respectively, on the semiconductor substrate, where the first gate region is in the first transistor region, where the second gate region is in the second transistor region, where the conductive material is deposited across each of the first adjacent fins, and where the conductive material is deposited across each of the second adjacent fins. The method also includes depositing a sacrificial mask over the conductive material over the first and second gate regions, where the sacrificial mask is deposited across each of the first adjacent fins, and where the sacrificial mask is deposited across each of the second adjacent fins, patterning the conductive material with the sacrificial mask to form a plurality of first and second conductive material segments respectively over the first and second gate regions, where each of the first conductive material segments extends across each of the first adjacent fins, and where each of the second conductive material segments extends across each of the second adjacent fins, removing the sacrificial mask, epitaxially growing a plurality of first source/drain regions from the semiconductor substrate in the first transistor region, where the first source/drain regions are grown across each of the first adjacent fins, epitaxially growing a plurality of second source/drain regions from the semiconductor substrate in the second transistor region, where the second source/drain regions are grown across each of the second adjacent fins, forming the first and second transistors, where a first gate of the first transistor has a first transistor gate length, where a second gate of the second transistor has a second transistor gate length, and where a ratio of the first transistor gate length to the second transistor gate length is greater than about 101, and electrically connecting the first and second source/drain regions to other devices.

In some embodiments, the conductive material includes polycrystalline silicon.

In some embodiments, a conductive material segment in a location between an isolation structure and one of the source/drain regions forms a poly on OD edge (PODE) dummy segment.

In some embodiments, the method further includes depositing a first dielectric layer over the sacrificial mask, depositing a second dielectric layer over the sacrificial mask, and planarizing the first and second dielectric layers such that none of the first and second dielectric layers remain over the sacrificial mask.

In some embodiments, the first and second transistors are FinFET transistors.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET semiconductor device, the method comprising:
    forming a plurality of adjacent fins in a semiconductor substrate;
    depositing a conductive material over the semiconductor substrate, wherein the conductive material is deposited across each of the adjacent fins;
    depositing a sacrificial mask over the conductive material, wherein the sacrificial mask is deposited across each of the adjacent fins;
    patterning the conductive material with the sacrificial mask to form a plurality of conductive material segments including first and second conductive material segments, wherein each of the conductive material segments extends across each of the adjacent fins;
    depositing a sacrificial layer over the sacrificial mask, wherein the sacrificial layer is formed across each of the adjacent fins, and wherein the sacrificial layer covers the sacrificial mask on the first and second conductive material segments;
    patterning the sacrificial layer to form an opening that exposes the sacrificial mask on the first conductive material segment, wherein the sacrificial layer remains covering the sacrificial mask on the second conductive material segment;
    removing the portion of the sacrificial layer over the sacrificial mask;
    after removing the portion of the sacrificial layer over the sacrificial mask, removing the sacrificial mask; and
    epitaxially growing a plurality of source/drain regions from the semiconductor substrate, wherein the source/drain regions are grown across each of the adjacent fins.

2. The method of claim 1, wherein the conductive material comprises polycrystalline silicon.

3. The method of claim 1, wherein the sacrificial layer comprises a photoresist layer.

4. The method of claim 1, wherein patterning the sacrificial layer comprises creating an opening in the sacrificial layer in a location corresponding with a gate of first and second transistor.

5. The method of claim 4, wherein the first transistor has a first gate length greater than a minimum gate length dimension allowed by process design rules.

6. The method of claim 5, wherein the second transistor has a second gate length substantially equal to the minimum gate length dimension allowed by process design rules.

7. The method of claim 1, wherein patterning the sacrificial layer comprises creating the opening in the sacrificial layer in a location corresponding with the sacrificial mask between an isolation structure and one of the source/drain regions.

8. The method of claim 1, wherein a conductive material segment in a location between an isolation structure and one of the source/drain regions forms a poly on OD edge (PODE) dummy segment.

9. A method of forming a FinFET semiconductor device, the method comprising:
   forming a plurality of adjacent fins in a semiconductor substrate;
   depositing a conductive material over the semiconductor substrate, wherein the conductive material is deposited across each of the adjacent fins;
   depositing a sacrificial mask over the conductive material, wherein the sacrificial mask is deposited across each of the adjacent fins;
   patterning the conductive material with the sacrificial mask to form a plurality of conductive material segments, wherein after patterning the conductive material, each of the conductive material segments continuously extends across each of the adjacent fins;
   depositing a first dielectric layer over the sacrificial mask, wherein the first dielectric layer is deposited across each of the adjacent fins;
   depositing a second dielectric layer over the sacrificial mask, wherein the second dielectric layer is deposited across each of the adjacent fins;
   planarizing the first and second dielectric layers such that none of the first and second dielectric layers remain over the sacrificial mask, wherein after the planarizing, a gap in the sacrificial mask in a location corresponding with one of the source/drain regions is filled with the first dielectric layer;
   after planarizing the first and second dielectric layers, removing the sacrificial mask; and
   epitaxially growing a plurality source/drain regions from the semiconductor substrate, wherein the source/drain regions are grown across each of the adjacent fins.

10. The method of claim 9, wherein the conductive material comprises polycrystalline silicon.

11. The method of claim 9, wherein the first dielectric layer comprises an ILD material layer.

12. The method of claim 11, wherein the second dielectric layer comprises a physical enhanced oxidation (PEOX) layer.

13. The method of claim 9, wherein after planarizing the first and second dielectric layers, top surfaces of the sacrificial mask and the first dielectric layer are substantially level.

14. The method of claim 9, wherein a conductive material segment in a location between an isolation structure and one of the source/drain regions forms a poly on OD edge (PODE) dummy segment.

15. The method of claim 9, further comprising forming first and second transistors, wherein the first transistor has a gate length greater than a minimum gate length dimension allowed by process design rules, and wherein the second transistor has a gate length substantially equal to the minimum gate length dimension allowed by process design rules.

16. A method of forming a FinFET semiconductor device, the method comprising:
   forming a plurality of first adjacent fins in a first transistor region of a semiconductor substrate;
   forming a plurality of second adjacent fins in a second transistor region of the semiconductor substrate;
   depositing a conductive material over first and second gate regions of first and second transistors, respectively, on the semiconductor substrate, wherein the first gate region is in the first transistor region, wherein the second gate region is in the second transistor region, wherein the conductive material is deposited across each of the first adjacent fins, and wherein the conductive material is deposited across each of the second adjacent fins;
   depositing a sacrificial mask over the conductive material over the first and second gate regions, wherein the sacrificial mask is deposited across each of the first adjacent fins, and wherein the sacrificial mask is deposited across each of the second adjacent fins;
   patterning the conductive material with the sacrificial mask to form a plurality of first and second conductive material segments respectively over the first and second gate regions, wherein after patterning the conductive material, each of the first conductive material segments continuously extends across each of the first adjacent fins, and wherein each of the second conductive material segments continuously extends across each of the second adjacent fins;
   patterning the sacrificial layer to form an opening that exposes the sacrificial mask on the first conductive material segments in the first transistor region, wherein the sacrificial layer remains covering the sacrificial mask on the second conductive material segments in the second transistor region;
   removing the portion of the sacrificial layer over the sacrificial mask in the first transistor region;
   removing the sacrificial mask from the first and second transistor regions;
   epitaxially growing a plurality of first source/drain regions from the semiconductor substrate in the first transistor region, wherein the first source/drain regions are grown across each of the first adjacent fins;
   epitaxially growing a plurality of second source/drain regions from the semiconductor substrate in the second transistor region, wherein the second source/drain regions are grown across each of the second adjacent fins; and
   forming the first and second transistors, wherein a first gate of the first transistor has a first transistor gate length, wherein a second gate of the second transistor has a second transistor gate length, and wherein a ratio of the first transistor gate length to the second transistor gate length is greater than about 10:1.

17. The method of claim 16, wherein the conductive material comprises polycrystalline silicon.

18. The method of claim 16, wherein a conductive material segment in a location between an isolation structure and at least one of the first and second source/drain regions forms a poly on OD edge (PODE) dummy segment.

19. The method of claim 16, further comprising:
depositing a first dielectric layer over the sacrificial mask;
depositing a second dielectric layer over the sacrificial mask; and
planarizing the first and second dielectric layers such that none of the first and second dielectric layers remain over the sacrificial mask.

20. The method of claim 16, wherein the first and second transistors are FinFET.

* * * * *